June 26, 1962 P. R. PENNINGTON 3,041,226

METHOD OF PREPARING SEMICONDUCTOR CRYSTALS

Filed April 2, 1958 3 Sheets-Sheet 1

Philip R. Pennington,
INVENTOR.

BY.

W. Hess Ollister, Jr.

ATTORNEY.

Philip R. Pennington,
*INVENTOR.*
*BY*
W Thomas Allister Jr.
*ATTORNEY.*

June 26, 1962 P. R. PENNINGTON 3,041,226

METHOD OF PREPARING SEMICONDUCTOR CRYSTALS

Filed April 2, 1958 3 Sheets-Sheet 3

Philip R. Pennington,
*INVENTOR.*

*BY.*

W. Thomas Allister Jr.

*ATTORNEY.*

United States Patent Office 3,041,226

Patented June 26, 1962

3,041,226

METHOD OF PREPARING SEMICONDUCTOR CRYSTALS

Philip R. Pennington, Inglewood, Calif., assignor to Hughes Aircraft Company, Culver City, Calif., a corporation of Delaware Filed Apr. 2, 1958, Ser. No. 725,954
19 Claims. (Cl. 156—17)

This invention relates to semiconductor devices and to methods for processing semiconductive monocrystalline bodies to provide recesses therein of controlled configuration and size. More particularly, but not necessarily exclusively, the invention relates to an improved method for producing a recess or pit in a surface of a monocrystalline silicon wafer whereby a conductivity-type-determining impurity may be fused to the silicon wafer in the recess thereby forming a rectifying junction in the wafer.

It is known to form semiconductive devices having p-n rectifying barriers or junctions. Such devices comprise a body of semiconducting material, generally of single crystalline structure, in which a zone of p-type conductivity is separated from a zone of n-type conductivity by a rectifying barrier. An example of such a device is one wherein a pellet, such as aluminum, capable of imparting or establishing p-type conductivity in silicon, is fused to a wafer of n-type silicon. During preparation, a part of the silicon wafer is melted or dissolved and alloyed with at least a portion of the aluminum pellet. Upon cooling and recrystallization of the melted portions, a p-type conductivity zone comprising an extension of the silicon crystal structure is formed. In this manner, a rectifying barrier is established between the p-type zone and the remainder of the n-type silicon wafer. A device including only one p-type region and one n-type region, and thus having only one rectifying barrier, is known as a diode or rectifier device. Devices including two rectifying barriers, one on either side of an n-type region, for example, are known as transistors or amplifiers.

In general, such an amplifier or transistor is made by fusing and alloying a material capable of imparting one type of conductivity to opposite surfaces of a semiconductive wafer of opposite conductivity. The conductivity-type-determining material may be vapor deposited or otherwise plated on opposite surfaces of the wafer. In either instance, a wafer is produced having a zone of one conductivity type at least partially sandwiched between zones of the opposite type of conductivity. These devices are generally identified as n-p-n or p-n-p junction transistors. The application of a positive potential to one of the p-type regions is a p-n-p junction transistor, for example, results in the injection of positive charge carriers across the p-n junction adjacent this p-type region and into the n-type region. Since this p-type region is injecting or emitting charge carriers across the junction, it is referred to as the "emitter." The region of n-type conductivity into which the charge carriers are injected in the instant example is termed the "base." The other p-type region on the opposite surface of the wafer is called the "collector" since it collects the charge carriers injected into the base by the emitter. It will thus be appreciated that a transistor comprises an emitter and collector region each of the same conductivity type separated by a base region of opposite conductivity with an emitter and a collector rectifying barrier respectively therebetween.

It is known that for optimum performance of such junction devices, the distance between the emitter and collector junctions (known as the base width) should be of the order of about 0.001 of an inch. In order to obtain such spacing or base width in a wafer which may be about 0.015 of an inch thick, the emitter and collector junctions must be established deep within the wafer. In practice, it has been found to be extremely difficult to accurately control the thickness of the base region when the emitter and collector regions must be formed more than about 0.002 of an inch below the surface of the wafer. Crystal imperfections, surface tension, and other metallurgical phenomena contribute to render accurate control of such deep penetration impractical. Too often the base region is either too thick or too thin. In the latter instance, short-circuiting occurs across the base region and the device fails to operate satisfactorily as an amplifier. In addition, the relatively large amounts of the conductivity-type-determining impurity and the high temperatures required to dissolve enough of the wafer to achieve the deep penetration adversely affect the mechanical and electrical properties of the device. It will be appreciated that the characteristic brittleness of silicon makes it impractical to provide initially a wafer thin enough to avoid the necessity of deep penetration in order to establish the desired rectifying junctions with the requisite base width therebetween.

Heretofore, these difficulties have been overcome by providing pits or recesses in the semiconductor wafer having the requisite shape and depth. The conductivity-type-determining impurity is placed in the appropriate recess and fused and alloyed to the wafer as described. For example, recesses have been provided in opposite surfaces of a wafer 0.015 of an inch thick so as to leave a spacing between the bottoms of the opposed recesses about 0.004 of an inch. Thus, in order to provide a base width of about 0.001 of an inch, the emitter and collector junction only need be established at a depth of about 0.0015 of an inch respectively. The spacing of the emitter and collector junctions established in this manner is relatively controllable. Furthermore, since the portions of the wafer surrounding the recessed regions are relatively thick, a less fragile and mechanically more rugged device results.

In the past, these recesses or pits were produced by sandblasting, ultrasonic cutting, or drilling or by electrolytic jet etching. While these processes have in general proven to be satisfactory, certain instances arise wherein it is desirable to provide recesses whose geometry and dimensions must be maintained within rather closely defined limits.

It is therefore an object of the instant invention to provide an improved method for forming recesses and the like in semiconductive crystalline bodies.

Another object of the invention is to provide an improved method for forming recesses and the like in monocrystalline silicon bodies.

These and other objects and advantages of the invention are accomplished by crystallographically damaging a crystalline body of silicon, for example, at the portion thereof whereat it is desired to form a recess. Thereafter, an etching solution, which may be an aqueous solution of an alkali metal hydroxide, for example, is brought into contact with at least the crystallographically damaged portion of the crystal body. Unexpectedly, it has been found that the extent of the damage in the crystalline body determines the depth of the recess formed by etching the damaged portion. Depthwise, the solution only removes portions of the crystal body to the depth to which the damage extends. It is thus possible to provide an etching action which is preferential depthwise and substantially only along the axis of crystallographic damage. Hence, by the method of the invention, the depth of the recess may be precisely established by controlling the depth of crystallographic damage. The width of the recess may be determined by controlling the time of etching. It has also been discovered that the shape of the recess unexpectedly depends upon the composition of the etching solution and that recesses formed in silicon bodies by the method of the invention have extraordinarily flat bottoms and relatively straighter walls than heretofore obtainable.

As used herein the term "crystallographic damage" is intended to include an internal stress or a strain intentionally induced or produced in the crystal lattice structure of a crystalline body by means of an externally applied force. It is to be understood that the term is intended to include damage to the crystal structure which may range from an observable damage line or fissure to a strain or stress resulting from the compression or other displacement of the atoms forming the crystal structure, in which latter instance the "damage" is latent and not readily observable but nonetheless existent. It will be further understood that the extent of the damage produced depends upon the nature of the crystalline structure, the amount of force applied, the extent of the area to which the force is applied, and the thickness of the crystalline body.

The invention will be described in greater detail by reference to the drawings wherein.

Figure 1:
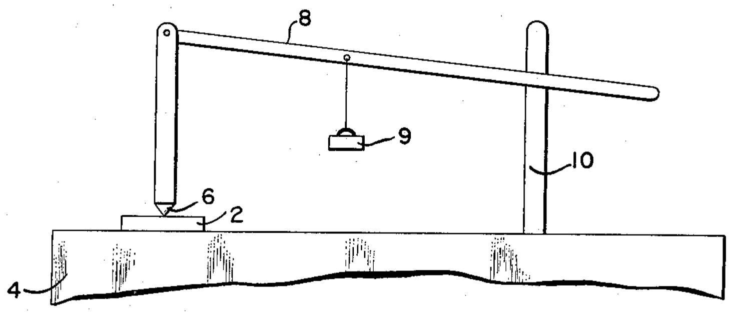
FIG. 1 is an elevational view of apparatus for producing crystallographic damage in a crystalline body.

In the art of manufacturing junction-type semiconductor transistor devices employing silicon, a wafer of silicon, preferably single crystalline, is utilized. The wafer or transistor blank 2, such as shown in FIG. 1, may be a square about 0.125 inch on a side and about 15 mils thick. The wafer may be of either n-type or p-type silicon, the conductivity type being established by growing a single crystalline ingot from a melt in which an appropriate conductivity-type-determining impurity is incorporated. P-type silicon may be provided by incorporating small amounts of aluminum in the melt, for example, while n-type silicon may be obtained by including arsenic in the melt. The single crystalline ingot of silicon grown from such a melt is then cut up into wafers or blanks of the kind described.

The crystallographic damage to the silicon wafer may be achieved by several techniques. The surface may be scratched as with a diamond point, for example. However, since primarily the depth or extent of damage into the crystalline wafer determines the depth of the recess formed, it is preferred to carefully control the damage. One method which may be employed is to apply relatively light pressure to a portion of the wafer by means of a weighted lever arrangement. Referring particularly now to FIG. 1, a silicon wafer 2 is placed upon a platform 4. A 3-sided diamond point 6, suspended from an end of a lever arm 8, is carefully brought into contact with the surface of the wafer 2 at the portion thereof whereat it is desired to cause crystallographic damage and form a recess. A diamond point is employed in order to minimize the possibility of extensive lateral damage in the crystal and to maximize the direction of damage perpendicularly to the crystal face (that is, depthwise in the crystal). Excessive laterally-extending damage will, of course, make it difficult to control the shape of the walls of the pit to be formed. To the lever arm 8, which is pivotedly supported to an upright member 10, a weight 9 is attached intermediate the pivot point and the end thereof from which the diamond point 6 is suspended.

It will be appreciated that the depth of damage produced by this technique is dependent upon the pressure applied to the crystal by the diamond point. For example, a contact force of one kilogram established by the weight 9 suspended on the lever arm 8 between the diamond point and a silicon crystal wafer will produce a depth of damage of from about two to three mils. The duration of the applied force does not appear to be critical or determinative of the extent of crystallographic damage induced in this manner.

Alternatively, the damaged area on the silicon wafer may be produced by employing a diamond point drill which is rotated while applying pressure to the area whereat damage is desired. By this technique, a depth of damage of about 10 mils in a silicon crystal is obtainable in about 15 to 30 seconds employing a drill pressure of about 5 lbs. while rotating the drill at a uniform speed of about 60 r.p.m.

The following data indicates the extent of damage which may be produced by either a non-rotated diamond point ("straight" force) or a rotated diamond point in contact with a silicon crystal body of about 8 mils thickness for about 3 seconds.

| Depth of Damage | "Straight" Force, g. | Rotational Pressure | |
|---|---|---|---|
| | | Pressure, g. | No. of Turns |
| 4.0 mils | 1,500 | 400 | 35–40 |
| 2.5 mils | 900 | 250 | 20–25 |

The influence of the thickness of the crystal body on the extent of damage is indicated by the following data in which two crystal bodies were subjected to a force of 500 grams.

| Crystal Thickness, mils | Depth of Damage, mils |
|---|---|
| 10 | 3.0 |
| 20 | 3.6 |

The next step in the process to produce a pit of desired depth and configuration is to etch the silicon crystal, or at least that portion thereof which has been damaged, with an alkali metal hydroxide solution. The etching time depends primarily upon the diameter of the pit desired. The stronger etches appear to form sharper pit bottom angles (that is, the bottom of the pit departs more radically from parallelism with the crystal surface or plane). Fairly regular hexagonally-shaped pits can be obtained with potassium hydroxide etches while sodium hydroxide etches tend to produce somewhat rounded pits having a trend toward a triangular shape. It is preferred, therefore, to employ a potassium hydroxide etch to produce a recessed silicon blank for a transistor device in order to obtain geometrical alignment between the emitter disposed on one surface of the crystal wafer and the collector disposed on the opposite surface of the wafer. The hexagonally shaped pits on each surface of the wafer permit such geometrical alignment while the triangularly-shaped pits on opposite surfaces do not, since the apex of the triangle on one surface is opposed to the base of the triangle on the opposite surface.

Figure 2:
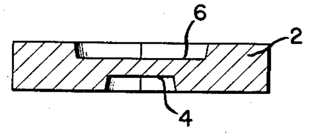
FIG. 2 is a sectional elevational view of a crystalline wafer having hexagonally shaped recesses therein on opposite surfaces thereof.
Figure 4:
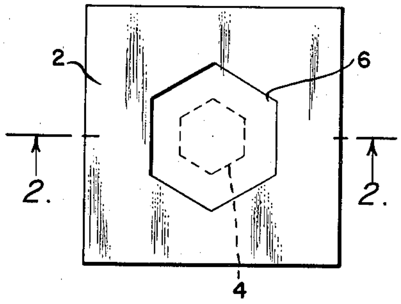
FIG. 4 is a plan view of the crystalline wafer shown in FIG. 2 having hexagonally shaped recesses in opposite surfaces thereof.

In general, a 30% aqueous solution of potassium hydroxide was found to give optimum results and resulted in pits or recesses such as shown in FIGS. 2 and 4. Solutions of less than 30% concentration resulted in pits whose geometry departed from the regular hexagonal shape. Solutions of less than 1% concentration were also found to be ineffective for etching silicon and for producing pits therein. Solutions of greater than 30% concentration resulted in non-geometrically shaped pits and in the bottom of the pit being angled from parallelism with the crystal surface or plane to a greater extent than desired. It will be appreciated that in the case of a junction transistor having an emitter and a collector disposed on opposite surfaces of a wafer that it is desirable that the junctions formed be planar and substantially parallel with respect to each other so as to provide a uniform and constant spacing between the junctions. With potassium hydroxide solutions of 30% concentration or less, the pit bottom angle varied from parallelism with the crystal plane or surface by less than one degree.

FIGS. 2 and 4 show a silicon wafer 2 of n-type conductivity having a hexagonally-shaped emitter recess or pit 4 and a hexagonally-shaped collector pit 6 produced according to the method of the invention. The wafer 2, of about 8 mils thick, is first damaged to a depth of about 1.5 mils on one surface for the emitter pit and to a depth of about 4.0 mils on the opposed surface for the collector pit. In both instances the crystallographic damage is produced by means of a diamond point acting with a force of 400 grams and 1500 grams for the emitter and collector pits, respectively. The collector surface is then brought into contact with a boiling etching solution comprising about 30% KOH in water. Almost immediately the damaged area of the collector surface is removed, forming a small pinpoint sized pit. Etching is continued for about 10 minutes. The entire wafer 2 is then immersed in the boiling etchant so that the emitter surface is in contact therewith and etching is continued for about 20 minutes. This process of letting the etching of the collector pit have a "head start" is desirable when providing a transistor having a collector of greater diameter than that of the emitter. During this second etching period the collector pit 6 continues to be etched, of course, so that upon expiration of the second etching period, an emitter recess 4 of about 32 mils in diameter and a collector recess 6 of about 48 mils in diameter are obtained. Both recesses have a hexagonal shape and are geometrically aligned with respect to each other, as shown in FIG. 4.

Alternatively, the silicon wafer 2 may be prepared to have hexagonally shaped emitter and collector pits 4 and 6, respectively, therein by using a sodium hydroxide etching solution. The wafer 2, of about 8 mils thick, is first damaged to a depth of about 1.5 mils on one surface for the emitter pit and to about 4.0 mils on the opposed surface for the collector pit as described in connection with the device shown in FIGS. 2 and 4. This depth of damage may be achieved by means of a diamond point acting with a force of about 400 grams and 1500 grams, respectively, for the emitter and collector pits. Thereafter the collector surface is etched with a boiling etching solution comprising about 20% NaOH in water for about 10 minutes. Thereafter, the entire wafer 2 is immersed in the boiling etchant and etching is continued for about 20 minutes. Upon the expiration of the second etching period, an emitter recess 4 of about 21 mils in diameter and a collector recess of about 32 mils in diameter are obtained. Both recesses have a hexagonal shape and are geometrically aligned with respect to each other, as shown in FIG. 4.

Figure 3:
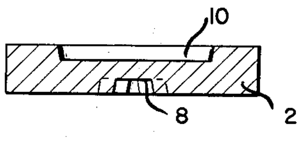
FIG. 3 is a sectional elevational view of a crystalline wafer having triangularly shaped recesses therein on opposite surfaces thereof.
Figure 5:
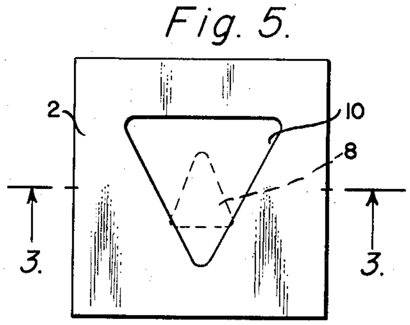
FIG. 5 is a plan view of the crystalline wafer shown in FIG. 3 having triangularly shaped recesses in opposite surfaces thereof.

Referring now to FIGS. 3 and 5, a wafer 2 of n-type silicon, about 10 mils thick, is shown having triangularly-shaped emitter and collector pits 8 and 10, respectively, produced by etching with a boiling 30% KOH aqueous solution and ethylene glycol in equal parts. In this example, the crystallographic damage is produced by rotating a diamond point 5 turns on one surface with a force of about 25 grams for the emitter recess and 10 turns on the opposite surface with a force of about 300 grams for the collector recess. Thereafter, the collector surface only is brought into contact with the boiling etching solution and so maintained for about 10 minutes. Thereafter the entire wafer is immersed in the solution and etching is continued for about an additional 20 minutes, resulting in the triangular recesses 8 and 10, as shown. The diameters of the pits thus obtained are about 32 and 48 mils, respectively. The sides of these pits are fairly straight, there being a slight curvature at each apex of the triangles formed.

Figure 6:
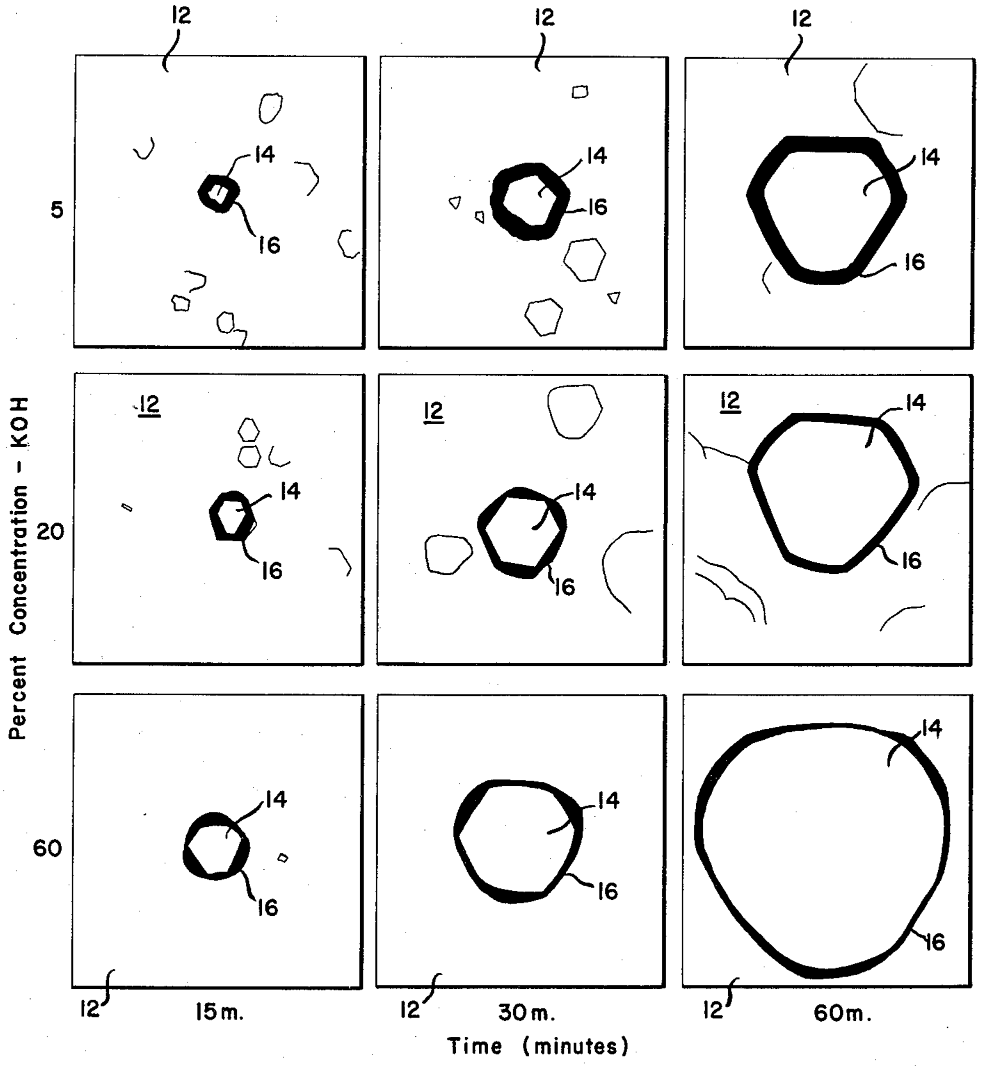
FIG. 6 shows plan views of various recesses therein produced by etching the wafers with potassium hydroxide solutions of various concentrations and for various periods of time.
Figure 7:
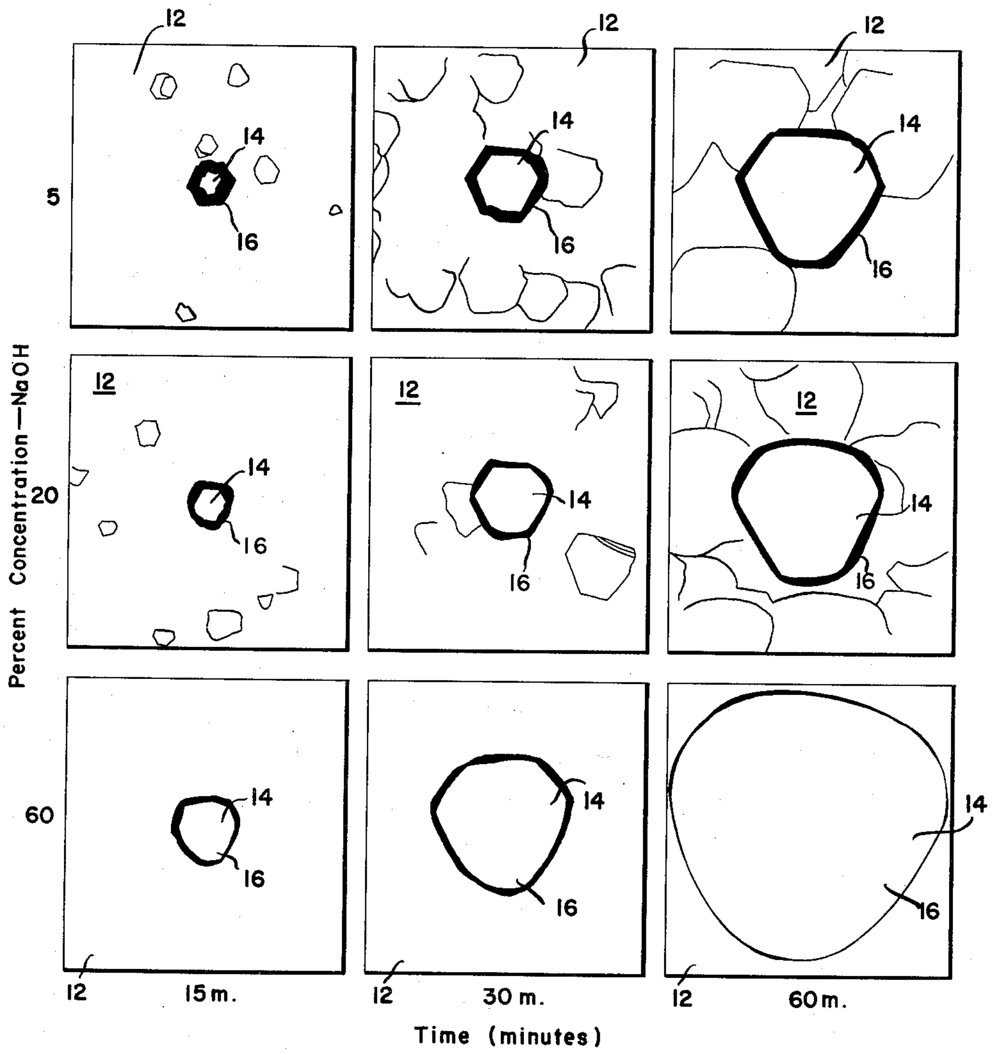
FIG. 7 shows plan views of various crystalline wafers having recesses therein produced by etching the wafers with sodium hydroxide solutions of various concentrations and for various periods of time.

FIGS. 6 and 7 show the relationship between recess size and shape on one hand and etching solution concentrations and etching times on the other hand. Both FIGS. 6 and 7 are drawn from photographs of actual crystal bodies. The photographs were made by employing a light source directly overhead and surfaces not perpendicular to the light beam are shown as dark or black areas. The top surfaces of the crystal bodies are designated by the numeral 12 and the pit or recess bottoms are designated by the numeral 14. The black or dark areas are the walls of the recesses and are designated by the numeral 16. For etching solution (potassium or sodium hydroxide), three different silicon crystal bodies were etched, each with a different concentration of etchant. The etching solutions were maintained at the boiling point throughout. Each horizontal row shows the effect of the particular etchant and concentration thereof on the crystal body with the passage of time.

Referring particularly to FIG. 6, it will be noted that the sides of the recesses obtained in the first and second crystals etched with 5% KOH and 20% KOH, respectively, are fairly straight. The sides of the recesses in the third crystal body etched with a 60% KOH solution are noticeably more curved in comparison with the recesses obtained in the first two crystal bodies etched with KOH solutions of lower concentration. In addition, the stronger solutions appear to make the slope of the recess walls steeper while the weaker solutions apparently tend to make the slope more shallow.

Referring now to FIG. 7, the sides of the recesses obtained in the first and second crystals etched with 5% NaOH and with 20% NaOH are likewise fairly straight but have a tendency to become more curved as the concentration of the solution is increased. The diameter of this recess is about 0.33". The sides of the recesses produced by etching the third crystal body with 60% NaOH are markedly notable for their curvature. All of the recesses exhibit a tendency to become triangular. It will be noted in comparison with the walls of the recesses produced with KOH solutions, that the walls of recesses resulting from NaOH etching, in general, are significantly straighter. As in the case of KOH etching solutions, the more concentrated solutions appear to result in more steeply sloped walls than do the less concentrated solutions.

It is preferred to maintain the temperature of the etching solutions at boiling point during etching in order to speed up the reaction and thus obtain the desired pits in the shortest possible time. It should be understood, however, that etching may be performed at lower temperatures if desired and hence at a slower etching rate. It should also be appreciated that etching concentrations from about 1% up to 40% are preferred only because of the desirable geometric shapes obtained therewith. Where such geometry is not particularly desired and where etching time is not a factor, etching solutions of almost any concentration may be employed. Recesses of various diameters and shapes have been obtained by etchants ranging from about 1.0% by weight to saturation. In every instance, however, the depth of the recess produced was determined by the extent of the intentional crystallographic damage.

It is also within the scope of the instant invention to employ additives in the etching solutions described. Alcoholic-type additives tend to produce much straighter walls and flatter or more planar bottoms. Equal volumes of 30% NaOH solution and ethylene glycol, for example, resulted in recesses having their bottoms departing from parallelism with the crystal plane by less than 20 minutes. Other additives, such as sodium carbonate, for example, may be employed to raise the boiling point of the etching solution and thus speed up the reaction.

It should also be understood that where it is desired to provide a transistor blank having recesses of about the same size, that the two-step etching process described need not be employed. To produce equal sized pits in the same crystal blank merely requires immersing the entire wafer or blank in the etchant. Since the extent of crystallographic damage determines the depth of the pit produced, it will be appreciated that pits of different depths may be produced simultaneously by the same etching solution.

It should be appreciated that the depth of the recess formed by etching is dependent upon the extent, depthwise, of the crystallographic damage and that the width of the recess is determined by the duration of etching.

There thus has been described a novel and readily controllable method for producing recesses or pits of any desired depth or width in a semiconductor crystal. The attainment of recesses with certain desirable geometric shapes has also been described. It will be understood that variations in the method of producing crystallographic damage and in the etching solutions and techniques may be made without departing from the scope of the invention. Such variations have been briefly indicated in the foregoing description.

What is claimed is:

1. A method of providing a flat bottomed recess to substantially a predetermined depth in a crystalline body, comprising the steps of: crystallographically damaging said body to substantially said predetermined depth through a surface thereof substantially parallel to a crystallographic plane of said body; and subsequently subjecting said surface of said body to an etchant to which said body is preferentially resistant in a direction perpendicular to said crystallographic plane for a period of time substantially in excess of that required to remove the crystallographically damaged portion of said crystal, whereby to produce in said surface a recess to substantially said predetermined depth having a substantially flat bottom substantially parallel to said crystallographic plane.

2. A method according to claim 1 wherein said crystal is of silicon semiconductor material, and the etchant is of the class consisting of an essentially aqueous solution of potassium hydroxide and an essentially aqueous solution of sodium hydroxide.

3. A method according to claim 2 wherein said etchant is of the class consisting of an essentially aqueous solution of from 1% to 40% potassium hydroxide and an essentially aqueous solution of from 1% to 40% sodium hydroxide.

4. A method according to claim 2 wherein the etchant includes an additive of the alcohol type whereby the etched bit formed has straighter sidewalls and a flatter bottom.

5. A method according to claim 2 wherein said body is subjected to said etchant at substantially its boiling temperature.

6. A method according to claim 1 wherein said crystalline body is initially damaged by a pointed tool under a predetermined force.

7. A method according to claim 2 wherein said body is of silicon semiconductor material, and said tool is a pointed diamond.

8. A method of providing a pair of oppositely disposed recesses in a crystalline body having a pair of initially substantially parallel surfaces substantially parallel to a crystallographic plane of said body, at least one of said recesses having a substantially flat bottom, comprising the steps of: crystallographically damaging said body through oppositely disposed points on said respective surfaces to a total depth less than the thickness of said body; and subsequently subjecting said surfaces of said body to etchant material to which said body is preferentially resistant in a direction perpendicular to said crystallographic plane, for a period of time substantially in excess of that required to remove the crystallographically damaged portion of said crystal.

9. A method according to claim 8 wherein only one of said surfaces of said body is initially subjected to said etchant, and subsequently both of said surfaces are subjected to said etchant.

10. A method according to claim 8 wherein said crystal is of silicon semiconductor material, and the etchant is of the class consisting of an essentially aqueous solution of potassium hydroxide and an essentially aqueous solution of sodium hydroxide.

11. A method according to claim 8 wherein said etchant is of the class consisting of an essentially aqueous solution of from 1% to 40% potassium hydroxide and an essentially aqueous solution of from 1% to 40% sodium hydroxide.

12. A method according to claim 8 wherein the etchant includes an additive of the alcohol type whereby the etched pits formed have straighter sidewalls and a flatter bottom.

13. A method according to claim 8 wherein said body is subjected to said etchant at substantially its boiling temperature.

14. A method according to claim 8 wherein said crystalline body is initially damaged by a pointed tool under a predetermined force.

15. A method according to claim 8 wherein said body is of silicon semiconductor material, and said tool is a pointed diamond.

16. A method of making a semiconductor device, which comprises: crystallographically damaging a body of semiconductive monocrystalline material through a surface thereof substantially parallel to a crystallographic plane thereof and to substantially a predetermined depth; subsequently subjecting said surface of said body to an etchant to which said body is preferentially resistant in a direction perpendicular to said crystallographic plane for a period of time substantially in excess of that required to remove the crystallographically damaged portion of material whereby to form a pit having a substantially flat bottom at substantially said predetermined depth; and subsequently forming at the bottom of said pit a zone of said material of an electrical conductivity type opposite to the type originally present in said material.

17. A method of making a semiconductor device, which comprises: crystallographically damaging a body of monocrystalline semiconductor material to a total depth less than the thickness of said body at substantially opposed points on a pair of surfaces thereof which are substantially parallel to a crystallographic plane thereof; subsequently subjecting said surfaces to etchant material to which said body is preferentially resistant in a direction perpendicular to said crystallographic plane for a period of time substantially in excess of that required to remove the crystallographically damaged portion of said body adjacent at least one of said surfaces whereby to produce a pair of opposed pits having respective depths substantially equal to the depth of said crystallographic damage at least one of which has a substantially flat bottom; and subsequently forming adjacent the bottom of each pit a zone of said body having an electrical conductivity type opposite to the type originally present in said material.

18. A method according to claim 17 wherein said monocrystalline semiconductor material is silicon, and said etchant is of the class consisting of an essentially aqueous solution of at least one percent potassium hydroxide and an essentially aqueous solution of at least one percent sodium hydroxide.

19. A method according to claim 18 wherein said zones of electrical conductivity type opposite to the type originally present are formed by alloying to the bottom surface of each pit a material at least comprising an electrical type determining material of a type opposite to that predominating originally in said body.

References Cited in the file of this patent

UNITED STATES PATENTS

| | | |
|---|---|---|
| 230,137 | Lapham | July 20, 1880 |
| 1,956,169 | Gelstharp et al. | Apr. 24, 1934 |
| 2,347,011 | Walker | Apr. 18, 1944 |
| 2,690,383 | Bradshaw | Sept. 28, 1954 |
| 2,767,137 | Evers | Oct. 16, 1956 |
| 2,797,193 | Eigler et al. | June 25, 1957 |
| 2,840,885 | Cressell | July 1, 1958 |
| 2,846,295 | Patterson et al. | Aug. 5, 1958 |
| 2,854,366 | Wannlund et al. | Sept. 30, 1958 |
| 2,858,730 | Hanson | Nov. 4, 1958 |